United States Patent
Perzlmaier et al.

(10) Patent No.: US 10,763,406 B2
(45) Date of Patent: Sep. 1, 2020

(54) SEMICONDUCTOR COMPONENT COMPRISING A FIRST AND A SECOND SHAPED BODY AND METHOD FOR PRODUCING A SEMICONDUCTOR COMPONENT COMPRISING A FIRST AND A SECOND SHAPED BODY

(71) Applicant: OSRAM OLED GMBH, Regensburg (DE)

(72) Inventors: Korbinian Perzlmaier, Regensburg (DE); Christian Leirer, Friedberg (DE)

(73) Assignee: OSRAM OLED GMBH, Regensburg (DE)

( * ) Notice: Subject to any disclaimer, the term of this patent is extended or adjusted under 35 U.S.C. 154(b) by 8 days.

(21) Appl. No.: 15/760,209

(22) PCT Filed: Sep. 14, 2016

(86) PCT No.: PCT/EP2016/071694
§ 371 (c)(1),
(2) Date: Mar. 14, 2018

(87) PCT Pub. No.: WO2017/050617
PCT Pub. Date: Mar. 30, 2017

(65) Prior Publication Data
US 2018/0254389 A1    Sep. 6, 2018

(30) Foreign Application Priority Data
Sep. 21, 2015   (DE) .......... 10 2015 115 900

(51) Int. Cl.
*H01L 29/08* (2006.01)
*H01L 33/00* (2010.01)
(Continued)

(52) U.S. Cl.
CPC ............ *H01L 33/54* (2013.01); *H01L 21/561* (2013.01); *H01L 21/568* (2013.01);
(Continued)

(58) Field of Classification Search
CPC ..... H01L 33/54; H01L 21/561; H01L 21/568; H01L 33/0079; H01L 33/0095;
(Continued)

(56) References Cited

U.S. PATENT DOCUMENTS

| 2012/0119233 A1 | 5/2012 | Weidner et al. |
| 2013/0313592 A1 | 11/2013 | Sugizaki et al. |

(Continued)

FOREIGN PATENT DOCUMENTS

| DE | 102012102847 A1 | 10/2013 |
| DE | 102013112549 A1 | 5/2015 |

(Continued)

*Primary Examiner* — Alonzo Chambliss
(74) *Attorney, Agent, or Firm* — MH2 Technology Law Group LLP

(57) ABSTRACT

The invention relates to a semiconductor component comprising: a semiconductor chip (10) which has a semiconductor body (1) with an active region (12) and a substrate (3) with a first conductor body (31), a second conductor body (32) and a first moulded body (33); and a second moulded body (5); wherein the second moulded body (5) completely surrounds the semiconductor chip (10) in lateral directions (L), the semiconductor chip (10) extends all the way through the second moulded body (5) in a vertical direction (V), at least some parts of an upper side and a lower side of the semiconductor chip (10) are not covered by the second moulded body (5), the substrate (3) is mechanically connected to the semiconductor body (2), the active region (12) is connected to the first conductor body (31) and the second conductor body (32) in an electroconductive manner, and the (Continued)

second moulded body (5) is directly adjacent to the substrate (3) and the semiconductor body (1).

14 Claims, 5 Drawing Sheets

(51) Int. Cl.
| | |
|---|---|
| *H01L 31/0203* | (2014.01) |
| *H01L 21/00* | (2006.01) |
| *H01L 51/40* | (2006.01) |
| *H01L 33/54* | (2010.01) |
| *H01L 33/48* | (2010.01) |
| *H01L 33/50* | (2010.01) |
| *H01L 33/62* | (2010.01) |
| *H01L 33/44* | (2010.01) |
| *H01L 21/56* | (2006.01) |
| *H01L 33/60* | (2010.01) |
| *H01L 33/46* | (2010.01) |
| *H01L 33/56* | (2010.01) |

(52) U.S. Cl.
CPC ...... *H01L 33/0093* (2020.05); *H01L 33/0095* (2013.01); *H01L 33/44* (2013.01); *H01L 33/486* (2013.01); *H01L 33/505* (2013.01); *H01L 33/60* (2013.01); *H01L 33/62* (2013.01); *H01L 33/46* (2013.01); *H01L 33/56* (2013.01); *H01L 2933/005* (2013.01); *H01L 2933/0033* (2013.01); *H01L 2933/0041* (2013.01); *H01L 2933/0058* (2013.01); *H01L 2933/0066* (2013.01); *H01L 2933/0091* (2013.01)

(58) Field of Classification Search
CPC ..... H01L 33/44; H01L 33/486; H01L 33/505; H01L 33/60; H01L 33/62
See application file for complete search history.

(56) References Cited

U.S. PATENT DOCUMENTS

| | | | |
|---|---|---|---|
| 2017/0077367 A1* | 3/2017 | Shimojuku | H01L 33/62 |
| 2018/0145225 A1* | 5/2018 | Perzlmaier | H01L 25/0753 |
| 2018/0197843 A1* | 7/2018 | Leirer | H01L 25/167 |
| 2019/0027669 A1* | 1/2019 | Perzlmaier | H01L 33/486 |
| 2019/0051802 A1* | 2/2019 | Perzlmaier | H01L 25/13 |

FOREIGN PATENT DOCUMENTS

| | | |
|---|---|---|
| DE | 102015114587 A1 | 3/2017 |
| EP | 2804225 A1 | 11/2014 |

* cited by examiner

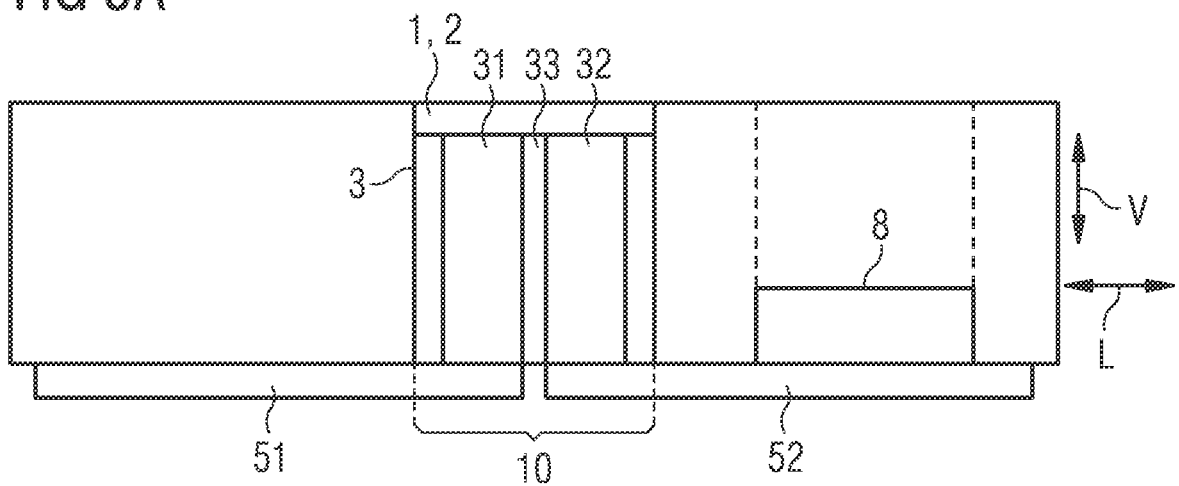
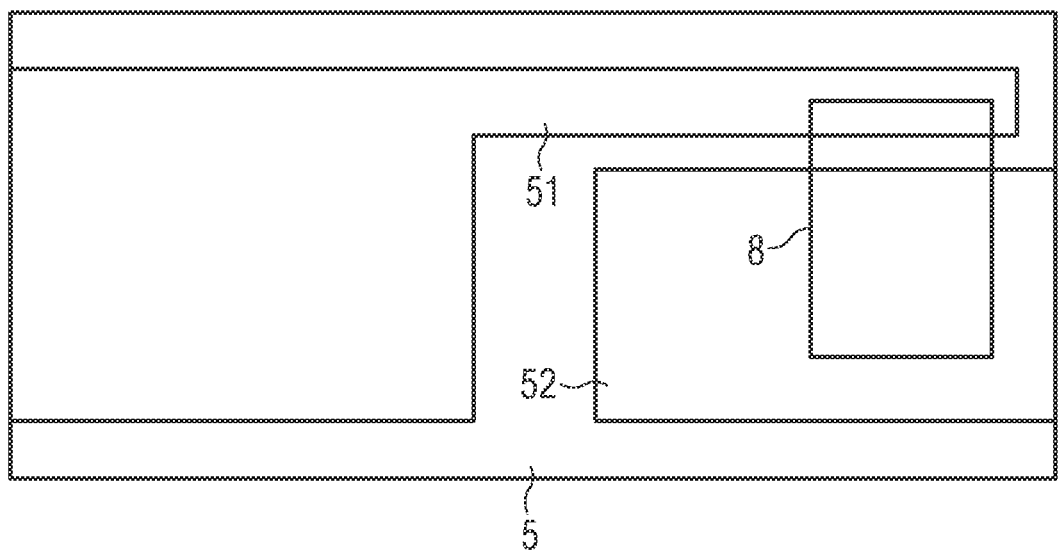

SEMICONDUCTOR COMPONENT COMPRISING A FIRST AND A SECOND SHAPED BODY AND METHOD FOR PRODUCING A SEMICONDUCTOR COMPONENT COMPRISING A FIRST AND A SECOND SHAPED BODY

The document US 2012/0119233 A1 describes a semiconductor component and a method for producing a semiconductor component.

An object to be achieved consists in providing a semiconductor component which can be produced particularly cost-effectively. A further object to be achieved consists in providing a method for producing such a semiconductor component.

A semiconductor component is provided. The semiconductor component can be for example an electronic, in particular an optoelectronic, semiconductor component. The optoelectronic semiconductor component can be designed to emit and/or detect electromagnetic radiation, in particular light, during operation.

According to at least one embodiment of the semiconductor component, the semiconductor component comprises a semiconductor chip. The semiconductor chip can be an electronic or an optoelectronic semiconductor chip. If the semiconductor chip is an optoelectronic semiconductor chip, the semiconductor chip is designed to emit and/or detect electromagnetic radiation, in particular light, during operation. In this case, the semiconductor chip can be e.g. an LED chip. In this case, the semiconductor component is a light-emitting diode.

The semiconductor chip comprises a semiconductor body having an active region. In the active region of the semiconductor body, the function of the semiconductor chip, e.g. the generation of light, is performed during operation of the semiconductor chip. The semiconductor body is e.g. at least partly epitaxially grown and is based on a III-V compound semiconductor material.

The semiconductor chip further comprises a carrier, which comprises a first conductor body, a second conductor body and a first shaped body. The carrier is in particular a, or the, mechanically supporting constituent of the semiconductor chip, which provides the semiconductor chip with at least part of its mechanical stability.

The carrier comprises at least one first conductor body and at least one second conductor body. By way of the conductor bodies, the semiconductor chip can be supplied with current during operation, in which case the at least one first conductor body and the at least one second conductor body are at different electrical potentials. The conductor bodies are formed e.g. as solid bodies, which contain or consist of at least one metal. The conductor bodies can be provided e.g. as solid bodies for producing the carrier or the conductor bodies are created during the production of the carrier, for example by electroless deposition or electroplating. The conductor bodies are distinguished by high electrical conductivity and high thermal conductivity.

Should the carrier comprise two or more first conductor bodies, these are at the same potential during operation of the semiconductor chip. Likewise, if two or more second conductor bodies are present, they are at the same potential during operation of the semiconductor chip, which differs from the potential of the first conductor body or bodies.

The conductor bodies can therefore be formed in one piece or in multiple pieces. If a conductor body is formed in multiple pieces, all pieces of the conductor body formed in multiple pieces are at the same electrical potential.

The carrier further comprises a first shaped body. The first shaped body is formed using an electrically insulating material. For example, the first shaped body can be formed using a plastics material. The first shaped body can partly or completely enclose the conductor bodies of the carrier in lateral directions. The lateral directions here are those directions that run parallel to a main extension plane of the semiconductor chip. It is possible in this case that the conductor bodies penetrate the first shaped body completely. The conductor bodies can be flush with the first shaped body on a top side of the carrier facing towards the semiconductor body and a side of the carrier facing away from the semiconductor body.

The first shaped body can be molded on to the conductor bodies. In particular, a direct interface can be present between the first shaped body and the conductor bodies. For example, the material of the first shaped body can be flowable for molding on to the conductor bodies and can solidify after being molded on. The first shaped body electrically isolates the first and second conductor bodies from one another, such that an electrical connection of the semiconductor body is possible by way of the conductor bodies. To this end, the first shaped body is located at least between the first and the second conductor body. Side faces of the carrier, which connect the top side and the bottom side of the carrier to one another, can be formed completely by the first solid body, for example, such that the conductor bodies are accessible for further contacting only on the bottom side of the carrier facing away from the semiconductor body. Alternatively, it is possible that the side faces are formed at least in some places by the conductor bodies. In this case, the conductor bodies are therefore exposed on the side faces of the semiconductor chip and the first shaped body is present in the region between the conductor bodies.

The first shaped body can be formed in one piece. The first shaped body can be formed using a matrix material, which comprises e.g. a thermoplastic and/or a thermoset and/or an epoxy material and/or a silicone material. Fillers can be incorporated into the matrix material, which affect mechanical, thermal, and/or optical properties of the first shaped body.

The semiconductor chip can comprise, besides the semiconductor body and the carrier, further elements such as for example contact layers and/or solder layers, which can be arranged for example on the bottom side of the carrier facing away from the semiconductor body.

According to at least one embodiment of the semiconductor component, the semiconductor component comprises a second shaped body. The second shaped body is formed using an electrically insulating material. For example, the second shaped body can be formed using a plastics material. The second shaped body can completely enclose the semiconductor chip in the lateral directions. It is possible in this case that the semiconductor chip completely penetrates the second shaped body in a vertical direction running perpendicular to the lateral directions. The second shaped body can be molded on to the semiconductor chip. In particular, a direct interface can be present between the second shaped body and the semiconductor chip. For example, the material of the second shaped body can be flowable for molding on to the semiconductor chip and can solidify after being molded on. Side faces of the semiconductor component, which join a top side and a bottom side of the semiconductor component to one another, can be formed completely by the second shaped body, for example. In this way, it is possible that the semiconductor chip is free from coverage by the second shaped body only on its top side, on which the semiconductor body is located, and on its bottom side, on which the carrier is located.

The second shaped body can be formed in one piece. The second shaped body can be formed using a matrix material, which comprises e.g. a thermoplastic and/or a thermoset and/or an epoxy material and/or a silicone material. Fillers can be incorporated into the matrix material, which affect mechanical, thermal, and/or optical properties of the second shaped body. The second shaped body can be formed using a material that differs from that of the first shaped body. It is possible in this case that the first and the second shaped body comprise both different matrix materials and different fillers. It is, however, also possible that the two shaped bodies comprise the same matrix material, for example, but differ from one another in terms of fillers in the matrix material. Likewise, it is possible that the two shaped bodies comprise different matrix materials and do not differ from one another in terms of the fillers that are introduced.

According to at least one embodiment of the semiconductor component, the second body surrounds the semiconductor chip completely in lateral directions. In other words, the semiconductor chip is enclosed by the second shaped body in the manner of a frame and the side face of the semiconductor component is formed completely by the second shaped body.

According to at least one embodiment of the semiconductor component, the semiconductor chip penetrates the second shaped body completely in the vertical direction. In other words, the top side and the bottom side of the semiconductor chip are free from the material of the second shaped body at least in some places, and in particular completely.

According to at least one embodiment of the semiconductor component, the carrier of the semiconductor chip is mechanically connected to the semiconductor body. The carrier can be detached from the semiconductor body of the semiconductor chip in particular only if at least one of the constituents of the semiconductor chip is destroyed. It is possible in this case that both the conductor bodies of the carrier and the first shaped body are mechanically connected to the semiconductor body. To this end, a connecting region can be arranged between the carrier and the semiconductor body, which provides a mechanical connection between the two constituents of the semiconductor chip.

According to at least one embodiment of the semiconductor component, the active region is electrically connected to the first conductor body and the second conductor body. In other words, the active region of the semiconductor chip is electrically connected by way of the two conductor bodies. During operation, the electrical current needed for operating the semiconductor chip flows by way of the first and second conductor bodies and supplies power to the active region by way of these.

According to at least one embodiment of the semiconductor component, the second shaped body directly borders the carrier and/or the semiconductor body and/or further elements of the semiconductor chip. In other words, the second shaped body directly borders the semiconductor chip and forms an intimate bond therewith, e.g. on the side faces of the semiconductor chip, such that the second shaped body is mechanically connected to the semiconductor chip. A detaching of the second shaped body from the semiconductor chip is then possible only by destroying one of the constituents of the semiconductor component. In this way, the second shaped body forms a package for the semiconductor chip, in which this is embedded in the lateral directions.

According to at least one embodiment, a semiconductor component is provided having
a semiconductor chip, which comprises a semiconductor body having an active region and a carrier having a first conductor body, a second conductor body and a first shaped body, and
a second shaped body, wherein
the second shaped body surrounds the semiconductor chip completely in lateral directions,
the semiconductor chip completely penetrates the second shaped body in a vertical direction,
a top side and a bottom side of the semiconductor chip are free from the second shaped body at least in some places,
the carrier is mechanically connected to the semiconductor body,
the active region is electrically connected to the first conductor body and the second conductor body,
the second shaped body directly borders the semiconductor chip, in particular the carrier and the semiconductor body.

A method for producing a semiconductor component is further provided. Using the method, in particular a semiconductor component as described here can be produced. In other words, all features disclosed for the semiconductor component are also disclosed for the method and vice versa.

According to at least one embodiment of the method for producing a semiconductor component, a plurality of semiconductor chips are first provided, each of the semiconductor chips comprising a semiconductor body having an active region and a carrier having a first conductor body, a second conductor body and a first shaped body. The semiconductor chips can in particular be semiconductor chips as described in more detail in association with the semiconductor component.

According to at least one embodiment of the method, in one method step the semiconductor chips of the plurality of semiconductor chips are attached to an auxiliary carrier. The semiconductor chips can in particular be attached to the auxiliary carrier by means of an adhesive which can be released thermally or by UV radiation. The thermally releasable adhesive can for example comprise a joining material into which particles of a material are introduced which expand in heat, thus allowing stripping.

The auxiliary carrier can comprise a base body for example on its side facing away from the semiconductor chips, which is formed using a rigid, self-supporting material, for example a metal. On the side facing towards the semiconductor chips, a film, e.g. a so-called thermal release film (for example "Revalpha tape") or a UV release film can be arranged on the auxiliary carrier by way of a connecting layer. The semiconductor chips in this case are attached to the auxiliary carrier at a distance from one another in lateral directions.

According to at least one embodiment of the method, an encapsulating of the plurality of semiconductor chips by a second shaped body takes place such that the second shaped body completely surrounds the plurality of semiconductor chips in lateral directions and the second shaped body directly borders the semiconductor chips, i.e. the carrier and the semiconductor body of each semiconductor chip. The second shaped body is in particular the second shaped body described in association with the semiconductor component.

The second shaped body in this case can be deposited in such a way that it covers, e.g. completely covers, the semiconductor chips on their side facing away from the auxiliary carrier such that, in a vertical direction perpendicular to the main extension plane of the auxiliary carrier, the second shaped body has a thickness which is greater than the thickness of the semiconductor chips. In this case, a further method step then takes place, in which the second shaped body is thinned such that the semiconductor chips are exposed on the top side of the second shaped body facing away from the auxiliary carrier. Alternatively, however, it is also possible that the second shaped body is deposited in such a way that the sides of the semiconductor chips facing away from the auxiliary carrier remain free from the material of the second shaped body.

According to at least one embodiment of the method, further method steps take place in which the auxiliary carrier is removed and the arrangement of semiconductor chips and second shaped body is singulated into a plurality of semiconductor components, each semiconductor component comprising at least one semiconductor chip.

According to at least one embodiment of the method, the method comprises the following steps:

providing a plurality of semiconductor chips, each of the semiconductor chips comprising a semiconductor body having an active region and a carrier having a first conductor body, a second conductor body and a first shaped body, attaching the semiconductor chips on to an auxiliary carrier, encapsulating the plurality of semiconductor chips with a second shaped body, such that the second shaped body completely surrounds the plurality of semiconductor chips in lateral directions and the second shaped body directly borders each semiconductor chip, removing the auxiliary carrier, singulating into a plurality of semiconductor components, each semiconductor component comprising at least one semiconductor chip.

The steps can be carried out in particular in the specified order in this case.

A semiconductor component as described here and a method as described here prove surprisingly advantageous in many ways. It is possible, for instance, to select different materials for the first shaped body and the second shaped body, which are adapted to the requirements of the shaped bodies. Owing to the fact that the second shaped body laterally surrounds the semiconductor chip and therefore the first shaped body, a semiconductor component can be provided in which, during operation, no electromagnetic radiation generated e.g. in the active zone impinges on the first shaped body. The first shaped body can therefore be formed using materials that are sensitive e.g. to the light or UV radiation generated by the semiconductor chip during operation.

Moreover, it is not necessary for the first shaped body to be formed in a particular color or with a particular reflectance. The optical effect of the semiconductor component can be established by appropriate selection of the material with which the second shaped body is formed. It is possible in this case, for example, for the second shaped body to be black, colored, or reflective white. Since no electromagnetic radiation can impinge on the first shaped body, this can be formed using radiation-sensitive materials such as e.g. an epoxy resin or an epoxy-silicone hybrid material. The second shaped body can then be formed using e.g. a silicone material as a matrix material.

Owing to the fact that the semiconductor chip completely penetrates the second shaped body in a vertical direction, it is furthermore unnecessary in the semiconductor component described here to introduce further conductor bodies into the second shaped body which completely penetrate the shaped body. This allows the semiconductor component to be produced particularly cost-effectively. In other words, in particular expensive metallic or semiconducting through-connection elements can be omitted.

Owing to the fact that the area of the semiconductor component is enlarged relative to the cross-sectional area of the semiconductor chip as a result of the second shaped body, semiconductor chips with very small edge lengths of <0.5 mm can be used, of which two or more semiconductor chips can be present per semiconductor component. Owing to the second shaped body and the production method described here, these small semiconductor chips can also be easily handled in the present semiconductor component and in the method described here, being easy to execute in the form of an SMD device, for example.

Since the carrier is formed using only conductor bodies and the first shaped body in the semiconductor chips used and the second shaped body can likewise be formed using a cost-effective plastics material, semiconductor chips with expensive semiconductor carriers or expensive package materials for packaging the semiconductor chips are not necessary.

The following embodiments relate to semiconductor components as described here and to methods as described here for producing semiconductor components.

According to at least one embodiment, the second shaped body directly borders the first shaped body in some places. In this case, the first shaped body is formed e.g. in such a way that it completely surrounds the conductor bodies of the semiconductor chip in lateral directions and a side face of the semiconductor chip is formed by the first shaped body in some places. In this case it is possible that the adhesion between the first shaped body and the second shaped body can be configured to be particularly resistant to mechanical load.

This can be achieved e.g. by selecting materials that adhere to one another particularly well for the materials of the first and second shaped body. This is possible e.g. if the first shaped body and the second shaped body contain the same or similar matrix materials. Moreover, the first shaped body can have patternings on its surface facing towards the second shaped body, such as for instance roughenings, projections, undercuts and/or notches, which increase adhesion to the second shaped body through the fact that the second shaped body engages in these patternings of the first shaped body.

This can be achieved e.g. by singulating the semiconductor chips during their production using a separating method which creates a roughened external surface of the first shaped body as a singulation trace. For example, the semiconductor chips can be singulated by sawing, whereby a roughened surface of the first shaped body, which comprises e.g. saw grooves, can be obtained. The second shaped body then engages in these singulation traces and is in this way particularly intimately connected to the first shaped body.

In addition, it is possible that the first shaped body comprises particulate fillers, which are exposed or present on an external surface of the shaped body and therefore protrude into the second shaped body and in this way an anchoring is produced between the two shaped bodies.

Moreover, it is possible that e.g. particulate fillers in the first shaped body are liberated at the external surface of the first shaped body by etching and the resulting indentations are filled with material of the second shaped body and in this way an anchoring of the second shaped body in the first shaped body takes place.

According to at least one embodiment, the second shaped body is formed to reflect light at least in some places. For example, the second shaped body can be formed to reflect light at least on its top side, on which the semiconductor body of the semiconductor chip is exposed. For example, the second shaped body has in its reflective regions a reflectance of at least 75%, at least 80% or in particular at least 90%, for the impinging electromagnetic radiation generated e.g. in the semiconductor chip during operation.

To this end, it is possible that, for example, the second shaped body is filled with particles of a scattering or reflective filler composed of e.g. a titanium oxide or a zirconium oxide.

According to at least one embodiment, the first shaped body is formed to absorb light, at least in some places. Since in the present semiconductor component it can advantageously be ensured that no electromagnetic radiation impinges on the first shaped body, this can be formed using a material which is radiation-sensitive but has e.g. particularly high mechanical resistance and/or particularly high thermal resistance. The material of the second shaped body can then be filled e.g. with fillers which impart a colored or black impression to the second shaped body, such that at least 50%, in particular at least 75%, of a radiation impinging on the first shaped body is absorbed.

According to at least one embodiment, the semiconductor body protrudes beyond the conductor bodies in lateral directions or is flush therewith. In other words, the conductor bodies, which can extend from the semiconductor body to the bottom side of the second shaped body facing away from the semiconductor body, are arranged completely below the semiconductor body in a top view and do not protrude laterally beyond the semiconductor body. In this way, and in particular in the event that the conductor bodies are completely enclosed by the material of the first shaped body, an anchoring of the conductor body in the second shaped body, which may be costly, is unnecessary and the material for the second shaped body does not have to be selected in terms of particularly good adhesion to the conductor bodies. Since additional metallic or semiconducting through-connection elements are also unnecessary in the present case owing to the second shaped body, this proves particularly advantageous.

According to at least one embodiment, an electrically insulating layer covers the carrier on its side facing away from the semiconductor body and the second shaped body on its side facing away from the semiconductor body in some places. The electrically insulating layer can comprise at least one first opening and at least one second opening in this case. The openings in the electrically insulating layer penetrate the electrically insulating layer completely. In the region of the opening, no material of the electrically insulating layer is present.

The electrically insulating layer is formed using e.g. a dielectric material. The electrically insulating layer can contain or consist of one of the following materials, for example: oxide, nitride, silicone, epoxy resin, polymer. In particular, it is also possible that the electrically insulating layer is formed using the same material as the first shaped body and/or the second shaped body or the same material as the matrix material of at least one of the shaped bodies.

The electrically insulating layer has a thickness in a vertical direction running perpendicular to the lateral direction which is less than the thickness of the second shaped body. Moreover, it is possible that the thickness is less than the thickness of the first shaped body. For example, the thickness of the electrically insulating layer is no more than 10% of the thickness of the second shaped body or no more than 10% of the thickness of the first shaped body. In this way, the electrically insulating layer barely represents an obstacle to heat which is brought thereto by way of the conductor bodies.

Through the first opening of the electrically insulating layer, a first connection point can be joined to the first conductor body, and a second connection point can be joined to the second conductor body through the second opening of the electrically insulating layer. The connection points are used for contacting the semiconductor chip from the outside and are arranged e.g. on a common surface, for example on the bottom side of the semiconductor chip and on the bottom side of the second shaped body. The semiconductor chip and therefore the semiconductor component can in this case be surface mountable.

The connection points are formed using an electrically conductive material and can comprise one or more metals. In particular, the connection points can have an external surface facing away from the semiconductor body which is distinguished by good joining characteristics, e.g. good solderability.

Instead of the openings in the electrically insulating layer, it is also possible that the two connection points are separated by the electrically insulating layer between them and the electrically insulating layer is arranged only between the connection points. In this case, the connection points form two regions separated by the insulating layer. The connection points in this case can extend to a side face of the component and in some places form the side face of the component.

The first conductor body is preferably at a first distance from the second conductor body and the first connection point is at a second distance from the second connection point, the first distance being less than the second distance. In other words, e.g. in a plane parallel to the main extension plane of the semiconductor chip, the first conductor body and the second conductor body are closer to one another than the first connection point and the second connection point.

The semiconductor component described here and the method described here are based inter alia on the finding that a cross-section of the conductor bodies in a plane parallel to the main extension plane of the semiconductor chip is crucial for the thermal behavior of the semiconductor chip. The larger the cross-section of the conductor bodies, the better heat can be dissipated from the active region by way of the conductor bodies. In particular, a large distance between the conductor bodies leads to inhomogeneous heat dissipation from the semiconductor body and thus to losses of efficiency. Moreover, inhomogeneous heat dissipation can lead to an inhomogeneous illumination pattern and to locally elevated temperatures in the semiconductor chip, ultimately resulting in more rapid ageing of the semiconductor chip.

On the other hand, the distance selected between the conductor bodies, in the event that a contacting of the semiconductor chip from the outside takes place directly by way of said conductor bodies and they are therefore exposed on the bottom side of the semiconductor chip, must not be too small since otherwise a minimum distance, which is necessary e.g. for connecting the semiconductor chip by means of soldering, is not observed. A semiconductor component as described here now surprisingly reconciles the two conflicting requirements mentioned above—a small distance between the conductor bodies to improve the thermal properties and a large distance between the connection points to facilitate a joining process, in particular a soldering process.

In particular, it is possible that the second distance, i.e. the distance between the connection points, is at least 1.45 times the first distance. The distance between the conductor bodies can then be 100 μm or less, for example 60 μm and less or 40 μm and less.

In a semiconductor component as described here, therefore, e.g. as part of a production method as described here, an electrically insulating layer is deposited on the bottom side of the carrier facing away from the semiconductor body and on the bottom side of the second shaped body facing away from the semiconductor body, which insulates the conductor bodies on their bottom side facing away from the semiconductor body and forms a new, electrically insulating rear side of the semiconductor component. The electrically insulating layer is open or not present at points where the connection points are formed, and the connection points are connected to the electrical conductor bodies by way of this opening.

In this way, it is possible to form the conductor bodies at the smallest possible distance from one another without having to consider any limitations in the subsequent joining process of the semiconductor component. The electrically insulating layer here can extend over the entire bottom side of the second shaped body facing away from the semiconductor body, such that the shaped body is completely covered by the electrically insulating layer on its bottom side.

According to at least one embodiment, the electrically insulating layer in some regions directly borders the conductor bodies, the connection points and the first shaped body as well as the second shaped body. The electrically insulating layer can therefore act as a mechanically connecting constituent between the above-mentioned constituents of the semiconductor component and further increase a mechanical stability of the semiconductor component.

According to at least one embodiment of the semiconductor component, the semiconductor component can comprise a plurality of semiconductor chips which are arranged at a distance from one another in the lateral directions. The semiconductor chips here can be semiconductor chips of the same type, which emit light of the same color during operation, for example. Moreover, it is possible that they are different-colored semiconductor chips, which can emit light of different colors, for example. The semiconductor chips are in each case embedded in the second shaped body in the manner described. An interconnection of the semiconductor chips, e.g. in a series or parallel connection, can take place by way of appropriate patterning of the electrically insulating layer and the connection points. Moreover, it is possible that an interconnection of the semiconductor chips takes place only by mounting the semiconductor component on an appropriately patterned connection carrier, e.g. a printed circuit board.

According to at least one embodiment, the plurality of semiconductor chips are arranged on the auxiliary carrier in such a way that the semiconductor body of each semiconductor chip faces towards the auxiliary carrier and the carrier of each semiconductor chip faces away from the auxiliary carrier. In this way, it is possible to thin the second shaped body on the auxiliary carrier after encasing the semiconductor chips without risking damage to the semiconductor body.

According to at least one embodiment, before the singulation and after the removal of the auxiliary carrier a conversion element is deposited on the side of the second shaped body and of the plurality of semiconductor chips originally facing towards the auxiliary carrier. The conversion element here comprises at least one luminescence conversion material, which is designed to convert electromagnetic radiation generated in the semiconductor chips during operation to radiation of a different, in particular a longer, wavelength. For example, the semiconductor component produced in this way can then emit mixed light, e.g. white mixed light, during operation. The conversion element can comprise a matrix material as well as the at least one luminescence conversion material. The conversion element is deposited e.g. by spraying, blade coating or spin coating. In the present method it is in particular possible that the semiconductor chips are pre-sorted (also known as binning) in terms of the wavelength of the light emitted by them during operation before being attached to the auxiliary carrier. In this way, the color location of the resulting mixed light, which is generated by conversion at the conversion element and primary radiation from the semiconductor chips, can be adjusted particularly accurately, since with an even layer thickness of the conversion element all semiconductor chips of the composite of semiconductor chips and second shaped body emit the same or substantially the same primary radiation.

The semiconductor component as described here and the method as described here are explained in more detail below with the aid of exemplary embodiments and the associated figures.

FIGS. 1A, 1B, 2, 3, 4, 5A and 5B show exemplary embodiments of semiconductor components as described here in schematic views.

Figure 1A:
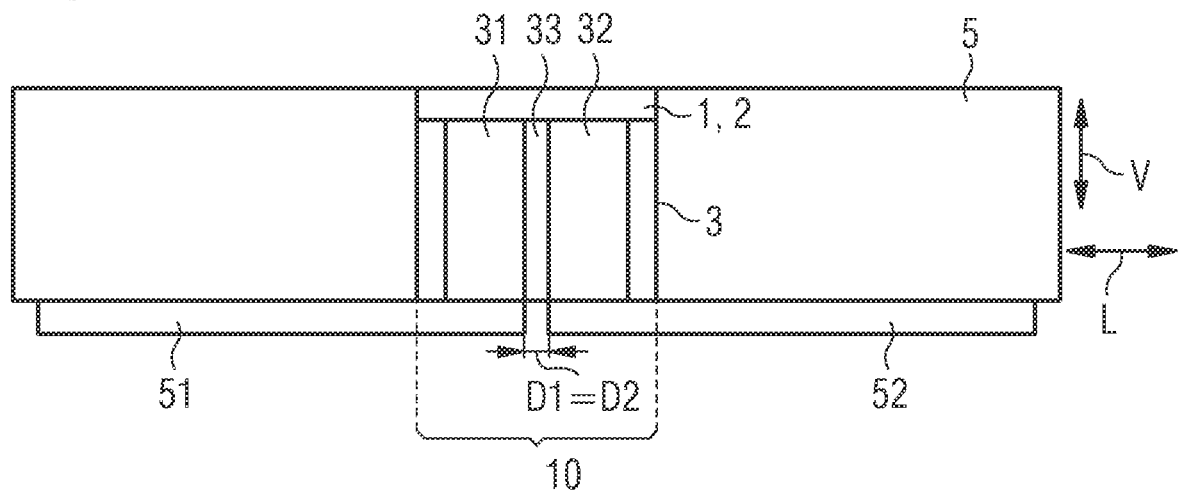

FIG. 1A shows with the aid of a sectional diagram a first exemplary embodiment of a semiconductor component as described here. The semiconductor component comprises a semiconductor chip 10. The semiconductor chip 10 comprises a semiconductor body 1, a connecting region 2 and a carrier 3. The semiconductor body 1 and the connecting region 2 are illustrated in more detail in the cut-out enlargement of FIG. 1B. The semiconductor body 1 is mechanically and electrically attached and connected to the carrier 3 by way of the connecting region 2.

The semiconductor body 1 comprises e.g. a first conductive region 11, which can be in n-type form, for example, an active region 12 and a second conductive region 13, which can be in e.g. p-type form. During operation of the semiconductor component, a function of the semiconductor chip is performed in the active region 12. For example, the semiconductor chip 10 can be a radiation-emitting semiconductor chip in which, during operation, light is generated in the active region 12, for example blue light. The semiconductor chip 10 is in this case e.g. an LED chip.

The semiconductor body 1 is connected to the carrier 3 by way of the connecting region 2 in a mechanically firm and electrically conductive manner. The connecting region 2 comprises e.g. a first contact layer 21, by way of which the second conductive region 13 of the semiconductor body 1 is contacted, and a second contact layer 22, by way of which the first conductive region 11 of the semiconductor body 1 can be contacted. For example, the first conductive region 11 is contacted by the second contact layer 22 by way of a through-connection 24. The through-connection 24 and the second contact layer 22 can be electrically separated from the first contact layer 21 by an insulation layer 23. The through-connection 24 here extends from the side of the semiconductor body facing away from the carrier 3 through the second conductive region 13 and the active region 12 into the first conductive region 11.

Figure 1B:
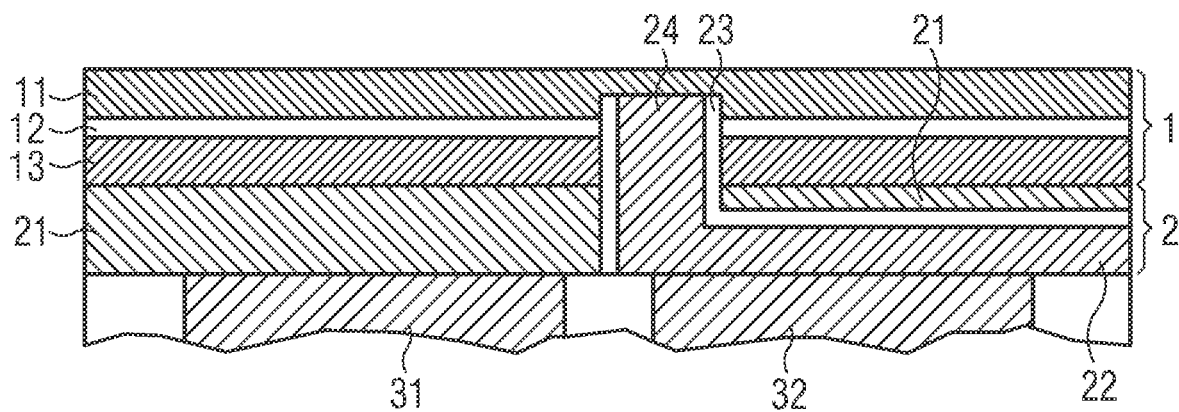

In the exemplary embodiment of FIGS. 1A and 1B, the first contact layer 21 and the second contact layer 22 run parallel to one another in some places and overlap in a vertical direction V, which runs perpendicular to the lateral directions L, which run parallel to a main extension plane of the semiconductor chip or of the semiconductor component.

The connecting region 2 can comprise further layers, which are designed for current conduction and/or other functions in the semiconductor chip, such as e.g. a reflection of electromagnetic radiation.

In addition, it is possible that the semiconductor body 1 and the connecting region 2 are formed differently from the illustration. For example, the semiconductor body 1 could be contacted without through-connections, or contact layers of the connecting region 2 do not run one above another in a vertical direction.

The semiconductor body 1 is mechanically connected to the carrier 3 by way of the connecting region 2. In other words, the semiconductor body 1 can only be detached from the carrier 3 if at least one of the constituents of the semiconductor chip 10 is destroyed. In the present exemplary embodiment, the carrier 3 comprises a first conductor body 31 and a second conductor body 32. The first conductor body 31 is electrically connected to the first contact layer 21 and the second conductor body 32 is electrically connected to the second contact layer 22. The conductor bodies 31, 32 are formed using e.g. a metal and are produced by electroplating, wherein a layer of the connecting region 2 can act as a seed layer for the deposition of the conductor bodies 31, 32 by electroplating. Moreover, it is possible that the conductor bodies 31, 32 are in the form of solid bodies, which are connected to the semiconductor body 1 by way of solder layers, which can likewise be parts of the connecting region 2.

The conductor bodies 31, 32 are completely enclosed by the first shaped body 33 in the lateral directions L in the present case and are flush with the shaped body 33 on both the top side of the carrier 3 facing towards the semiconductor body 1 and the bottom side of the carrier 3 facing away from the semiconductor body 1. The conductor bodies 31, 32 here are arranged at a distance D1 from one another.

A preferred embodiment of the semiconductor chip 10 is described for example in the German patent application DE 102015114587.1, the disclosure content of which is hereby explicitly incorporated by reference.

The semiconductor chip 10 is completely surrounded in lateral directions L by the second shaped body 5, which directly borders the carrier 3 as well as the semiconductor body 1 and the connecting region 2. In the present case, the semiconductor chip 10 penetrates the second shaped body 5 completely in the vertical direction V.

The second shaped body 5 in the present exemplary embodiment here directly borders the first shaped body 33 and the semiconductor body 1.

On the bottom side of the conductor bodies 31, 32, of the first shaped body 33 and of the second shaped body 5 facing away from the semiconductor body 1, first and second connection points 51, 52 are formed, which form the connection point for mounting and connecting the semiconductor component.

Figure 2:
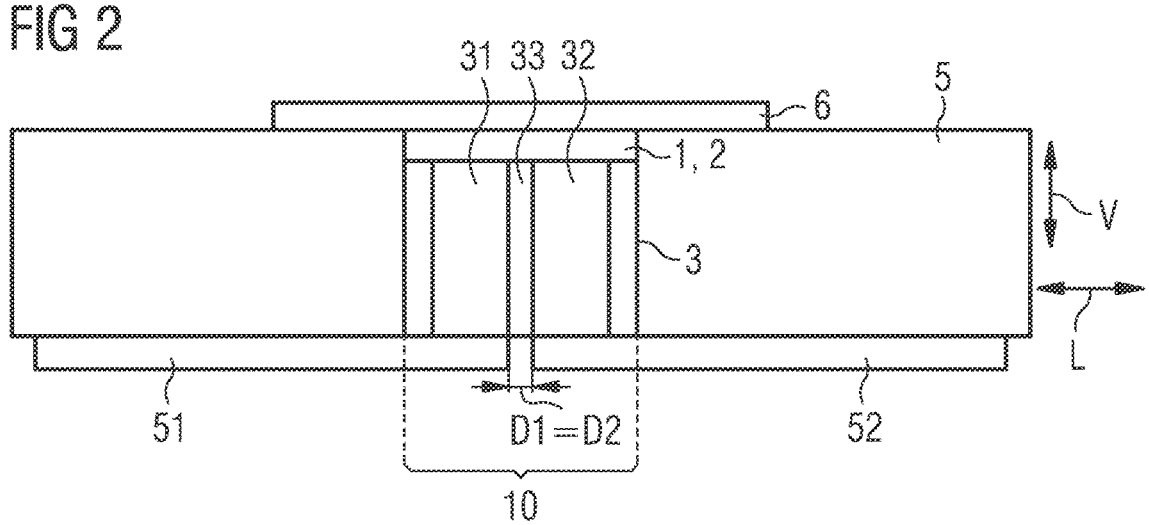

FIG. 2 shows a further exemplary embodiment of a semiconductor component as described here in a schematic sectional diagram. Differing from the semiconductor component of FIG. 1A, in this exemplary embodiment a conversion element 6 is arranged on the top side of the second shaped body 5 and of the semiconductor body 1, completely covering the semiconductor body 1 and at least partly covering the shaped body 5. The shaped body 5 here is flush with the semiconductor body 1 on the top side. On the bottom side of the shaped body 5 it is possible that this is flush with the conductor bodies 31, 32 and the first shaped body 33.

Figure 3:
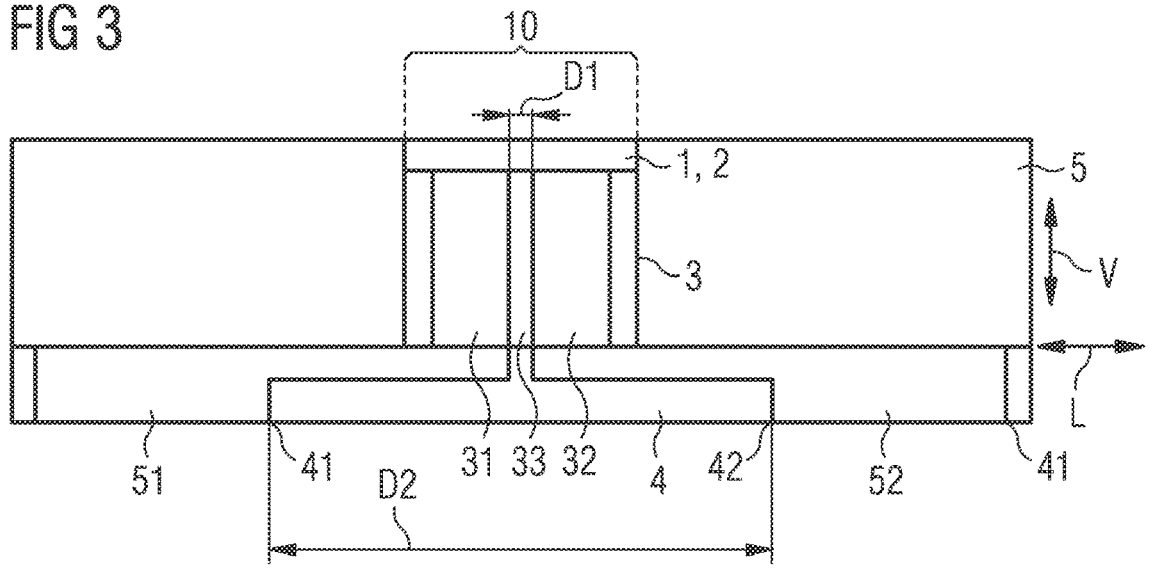

In the exemplary embodiment of FIG. 3, the semiconductor component comprises the electrically insulating layer 4 on the bottom side of the second shaped body 5. The electrically insulating layer 4 covers the second shaped body and the first shaped body 33 at least in some places and is in direct contact with the shaped bodies 5, 33. In this exemplary embodiment it has openings 41, 42, in which material of the connection points 51, 52 is arranged, said material being e.g. a metal. The connection points 51, 52 are in direct contact with the conductor bodies 31, 32 in the openings 41, 42. The connection points 51, 52 are arranged at a distance D2 from one another, which is greater than the distance D1 between the conductor bodies 31, 32. In this way, a solderability of the semiconductor component is facilitated. It is also possible, however, that the electrically insulating layer 4 is present exclusively between the connection points 51, 52 and not on the side faces of the device.

Figure 4:
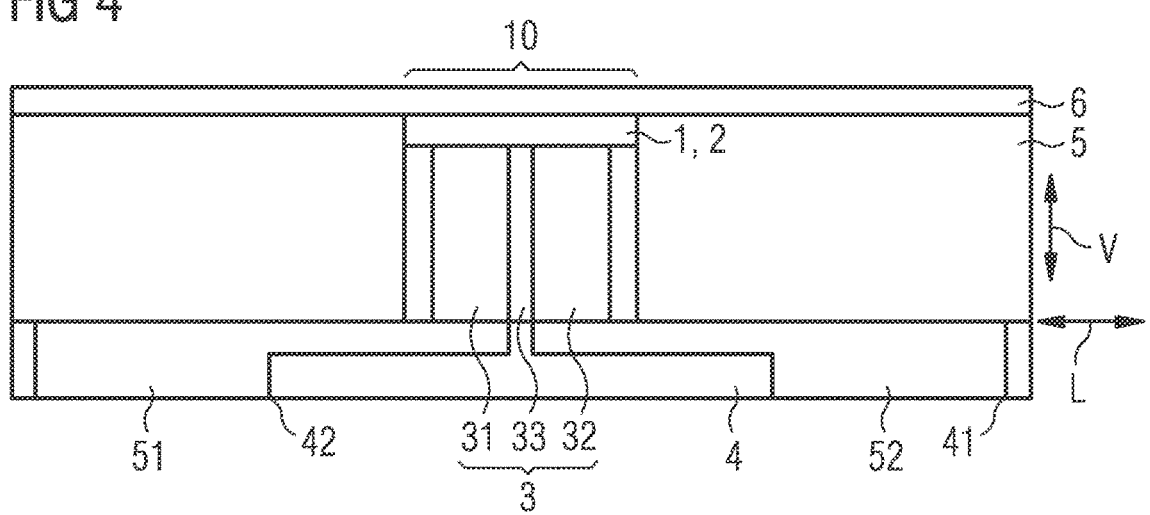

In FIG. 4, a further exemplary embodiment of a semiconductor component as described here is shown in more detail with the aid of a schematic sectional diagram. Differing from the exemplary embodiment of FIG. 3, the top side of the semiconductor chip 1 and of the second shaped body 5 in this exemplary embodiment is completely covered by the conversion element 3.

In association with the schematic illustrations of FIGS. 5A and 5B, a further exemplary embodiment of a semiconductor component as described here is described, in which a planar ESD protection diode is also introduced into the second shaped body 5 as an ESD protection element 8 and at least partly embedded there. The ESD protection element 8 can have a thickness in a vertical direction which corresponds for example to no more than the thickness of the second shaped body 5 and in this case completely penetrates this. A connection of the ESD protection element 8, e.g. in antiparallel with the active region 12 of the semiconductor chip 10, can then take place by appropriate patterning of the connection points 51, 52, as shown schematically in the top view of FIG. 5B.

In association with FIGS. 6A to 6G, with the aid of schematic sectional diagrams an exemplary embodiment of a method as described here for producing a semiconductor component is explained. In the method, a plurality of semiconductor chips 10 are provided, which can be e.g. LED chips, which are pre-sorted in terms of electromagnetic radiation emitted during operation. The semiconductor chips 10 are positioned with the side on which the semiconductor body 1 is located facing towards the auxiliary carrier 7. The auxiliary carrier 7 comprises e.g. a base body 51, which is formed using a rigid material, e.g. a metal. Moreover, the auxiliary carrier 7 comprises a connecting layer 72, with which a film 73 is attached to the base body 71. The film 73 is e.g. a thermally releasable film, which comprises a thermally releasable adhesive 74 on its side facing away from the base body 71, with which the semiconductor chips 10 are attached to the auxiliary carrier in a thermally releasable manner.

Figure 6A:
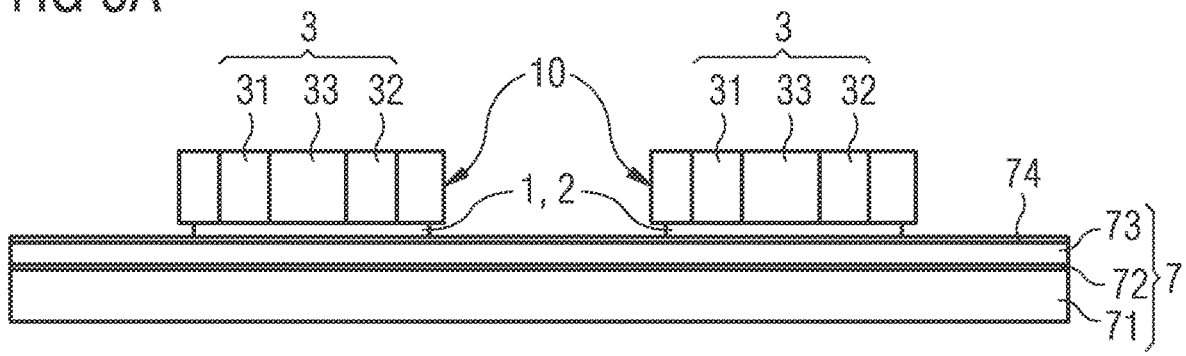
FIGS. 6A, 6B, 6C, 6D, 6E, 6F, 6G show, with the aid of schematic sectional diagrams, method steps of an exemplary embodiment of a method as described here.
Figure 6B:
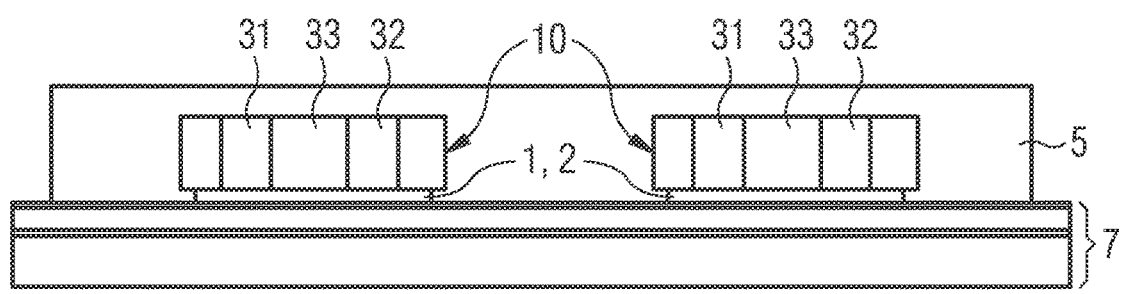

In a next step, FIG. 6B, the second shaped body 5 is deposited e.g. by molding in such a way that it is arranged between and over the semiconductor chips 10.

Figure 6C:
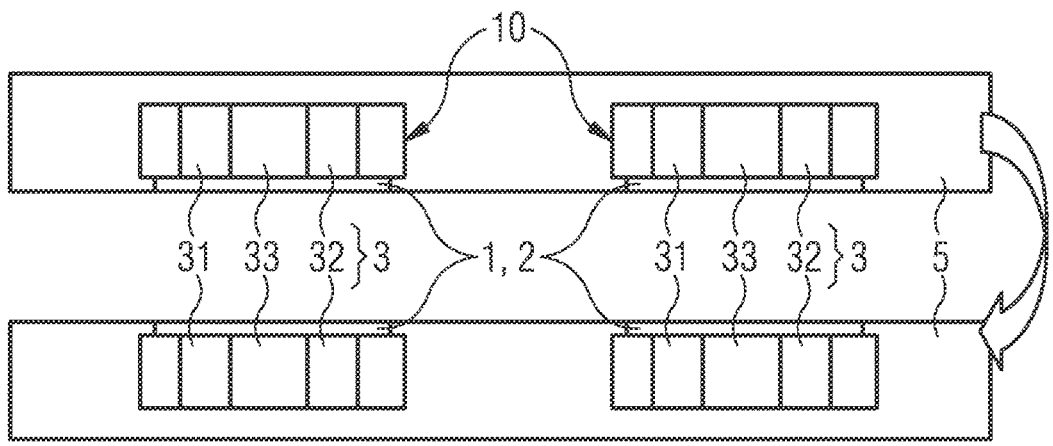

In a next method step, FIG. 6C, the auxiliary carrier 7 is peeled off the second shaped body 5 and the semiconductor chip 10.

Figure 6D:
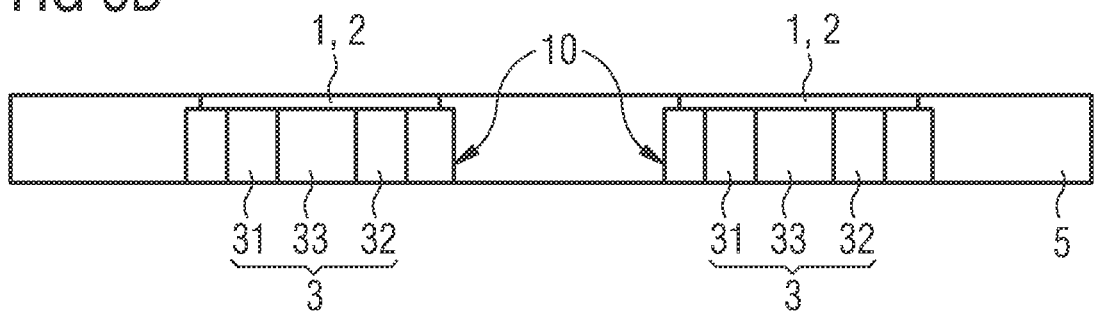

Next, FIG. 6D, a method step takes place in which the second shaped body 5 is thinned, e.g. by grinding, such that the first conductor body 31 and the second conductor body 31 are exposed on the bottom side thereof. This method step can be omitted if the second shaped body 5 is not arranged over the semiconductor chips 10 but the top side of the semiconductor chips 10 facing away from the auxiliary carrier 7 remains free from the second shaped body 5. For example, the shaped body 5 can be deposited by transfer molding for this purpose.

Figure 6E:
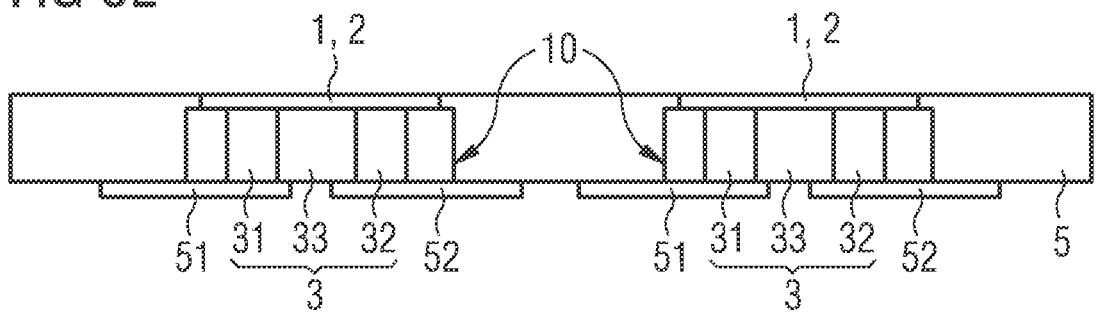

In a next method step, FIG. 6E, the deposition of the connection points 51, 52 can take place, by way of which the semiconductor chips 10 can also be connected to one another in an electrically conductive manner.

Figure 6F:
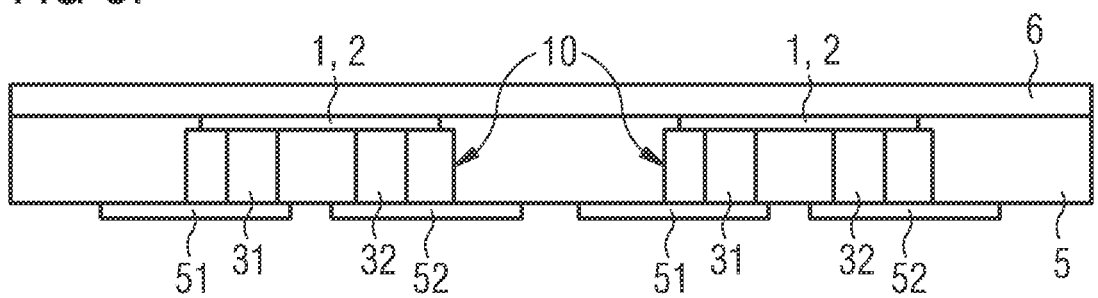

In the subsequent method step, FIG. 6F, the deposition of a conversion element 6 optionally takes place, for example by spray coating.

Figure 6G:
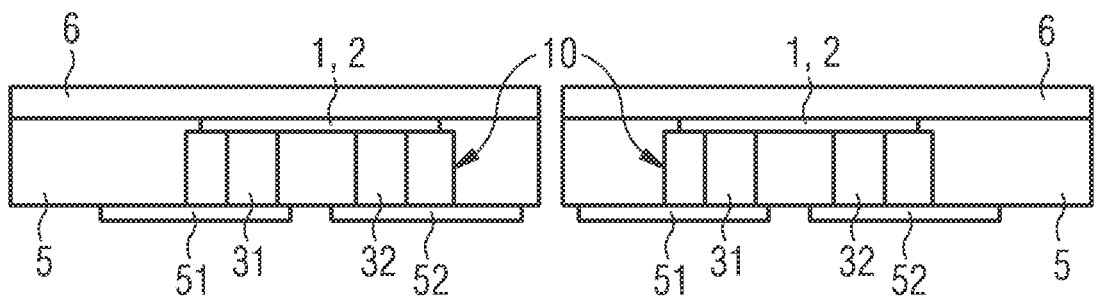

This is followed by singulating into individual semiconductor components, see FIG. 6G, each comprising at least one semiconductor chip 10.

The description with the aid of the exemplary embodiments does not limit the invention thereto. Rather, the invention comprises any new feature and any combination of features, which in particular includes any combination of features in the patent claims, even if this feature or this combination is not itself explicitly stated in the patent claims or exemplary embodiments.

The priority of the German patent application DE 102015115900.7 is claimed, which is hereby incorporated by reference.

REFERENCE NUMBERS

1 Semiconductor body
11 First conductive region
12 Active region
13 Second conductive region
2 Connecting region
21 First contact layer
22 Second contact layer
23 Insulation layer
24 Through-connection
3 Carrier
31 First conductor body
32 Second conductor body
33 First shaped body
4 Electrically insulating layer
41 First opening
42 Second opening
5 Second shaped body
51 First connection point
52 Second connection point
6 Conversion element
7 Auxiliary carrier
71 Base body
72 Connecting layer
73 Film
74 Adhesive
8 ESD protection element
10 Semiconductor chip

The invention claimed is:

1. A semiconductor component having
a semiconductor chip, which comprises a semiconductor body having an active region and a carrier having a first conductor body, a second conductor body and a first shaped body, and
a second shaped body, wherein
the second shaped body completely surrounds the semiconductor chip in lateral directions (L),
the semiconductor chip completely penetrates the second shaped body in a vertical direction (V),
a top side and a bottom side of the semiconductor chip are free from the second shaped body at least in some places,
the carrier is mechanically connected to the semiconductor body,
the active region is electrically connected to the first conductor body and the second conductor body,
the second shaped body directly borders the semiconductor chip, in particular the carrier and the semiconductor body,
the first shaped body is formed using a matrix material, and
wherein the matrix material comprises a thermoplastic and/or a thermoset and/or an epoxy material and/or a silicone material.

2. The semiconductor component according to claim 1, in which the second shaped body directly borders the first shaped body in some places.

3. The semiconductor component according to claim 1, in which the second shaped body is formed to reflect light at least in some places.

4. The semiconductor component according to claim 1, in which the first shaped body is formed to absorb light at least in some places.

5. The semiconductor component according to claim 1, in which the semiconductor body protrudes beyond the conductor bodies in lateral directions or is flush therewith.

6. The semiconductor component according to claim 1 having
an electrically insulating layer,
a first connection point, which is electrically conductive, and a second connection point, which is electrically conductive, wherein
the electrically insulating layer covers the carrier on the side thereof facing away from the semiconductor body and the second shaped body in some places,
the first connection point is electrically connected to the first conductor body,
the second connection point is electrically connected to the second conductor body,
the first conductor body is at a first distance (D1) from the second conductor body,
the first connection point is at a second distance (D2) from the second connection point on the bottom side of the electrically insulating layer facing away from the semiconductor chip and
the first distance (D1) is less than the second distance (D2).

7. The semiconductor component according to claim 6, in which
the electrically insulating layer comprises a first opening and a second opening,
the first connection point is electrically joined to the first conductor body through the first opening and
the second connection point is electrically joined to the second conductor body through the second opening.

8. The semiconductor component according to claim 6, in which the electrically insulating layer directly borders the conductor bodies, the connection points, the first shaped body and the second shaped body in some regions.

9. The semiconductor component according to claim 1, in which the semiconductor component comprises a plurality of semiconductor chips, which are arranged at a distance from one another in the lateral directions.

10. The semiconductor component according to claim 1, wherein the first shaped body completely encloses the first conductor body and the second conductor body in lateral directions.

11. A method for producing a semiconductor component having the following steps
- providing a plurality of semiconductor chips, wherein each of the semiconductor chips comprises a semiconductor body having an active region and a carrier having a first conductor body, a second conductor body and a first shaped body, wherein the first shaped body is formed using a matrix material,
- attaching the semiconductor chips on to an auxiliary carrier,
- encapsulating the plurality of semiconductor chips with a second shaped body, such that the second shaped body surrounds the plurality of semiconductor chips completely in lateral directions (L) and the second shaped body directly borders each semiconductor chip,
- removing the auxiliary carrier, and
- singulating into a plurality of semiconductor components, wherein each semiconductor component comprises at least one semiconductor chip,
- wherein the matrix material comprises a thermoplastic and/or a thermoset and/or an epoxy material and/or a silicone material.

12. The method according to claim 11, wherein the plurality of semiconductor chips are arranged on the auxiliary carrier in such a way that the semiconductor body of each semiconductor chip faces towards the auxiliary carrier and the carrier of each semiconductor chip faces away from the auxiliary carrier.

13. The method according to claim 11, wherein before the singulating and after the removal of the auxiliary carrier a conversion element is deposited on the side of the second shaped body and the plurality of semiconductor chips originally facing towards the auxiliary carrier.

14. A semiconductor component having
- a semiconductor chip, which comprises a semiconductor body having an active region and a carrier having a first conductor body, a second conductor body and a first shaped body, and
- a second shaped body, wherein
- the second shaped body completely surrounds the semiconductor chip in lateral directions (L),
- the semiconductor chip completely penetrates the second shaped body in a vertical direction (V),
- a top side and a bottom side of the semiconductor chip are free from the second shaped body at least in some places,
- the carrier is mechanically connected to the semiconductor body,
- the active region is electrically connected to the first conductor body and the second conductor body,
- the second shaped body directly borders the semiconductor chip, in particular the carrier and the semiconductor body, and wherein the first shaped body completely encloses the first conductor body and the second conductor body in lateral directions.

* * * * *